(12) United States Patent
Boulanger

(10) Patent No.: US 7,880,081 B2
(45) Date of Patent: Feb. 1, 2011

(54) LIMITED DISCHARGE CURRENT PROPAGATION SOLAR GENERATOR

(75) Inventor: Bernard Boulanger, Frejus (FR)

(73) Assignee: Thales, Neuilly sur Seine (FR)

( * ) Notice: Subject to any disclaimer, the term of this patent is extended or adjusted under 35 U.S.C. 154(b) by 1226 days.

(21) Appl. No.: 11/387,731

(22) Filed: Mar. 24, 2006

(65) Prior Publication Data

US 2006/0225779 A1 Oct. 12, 2006

(30) Foreign Application Priority Data

Mar. 24, 2005 (FR) .................................. 05 50768

(51) Int. Cl.
*H01L 31/00* (2006.01)
(52) U.S. Cl. ...................... 136/255; 136/293
(58) Field of Classification Search ................. 136/244, 136/255, 293
See application file for complete search history.

(56) References Cited

U.S. PATENT DOCUMENTS

| | | | |
|---|---|---|---|
| 6,243,243 B1 | 6/2001 | Gelderloos | |
| 6,248,950 B1 * | 6/2001 | Hoeber et al. | 136/251 |
| 2002/0195136 A1 * | 12/2002 | Takabayashi et al. | 136/244 |
| 2004/0112419 A1 * | 6/2004 | Boulanger | 136/244 |

FOREIGN PATENT DOCUMENTS

| | | | |
|---|---|---|---|
| EP | 0 938 141 A2 | 8/1999 | |
| GB | 2 128 017 A | 4/1984 | |
| JP | H03-253233 | * 11/1991 | |
| JP | 2003-092418 | * 3/2003 | |

OTHER PUBLICATIONS

Patent Abstracts of Japan, vol. 005, No. 095 Jun. 20, 1981 corresponding to JP 56038872 A (NEC Corp.) dated Apr. 14, 1981.
Patent Abstracts of Japan, vol. 2003, No. 07 Jul. 3, 2003 corresponding to JP 2003 092418 A (Nissan Motor Co., Ltd.) dated Mar. 28, 2003.
A. Meulenberg "Overview, Testing and Solutions to ESD-Induced, Solar-Arrya String, On-Orbit Failures" Progress in Photovoltaics. Research and Applications, John Wiley and Sons, Chichester, GB, vol. 8, No. 3 May 2000 , pp. 315-321, XP000963159.

* cited by examiner

*Primary Examiner*—Ula C Ruddock
*Assistant Examiner*—J. Christopher Ball
(74) *Attorney, Agent, or Firm*—Sughrue Mion, PLLC

(57) ABSTRACT

A solar generator has at least two branches electrically connected in parallel at opposite first and second ends of positive and negative polarity, respectively, each branch comprising one or more photoelectric cells electrically connected in series and having a first end provided with first blocking means adapted to block an electrical current coming from an adjacent branch. The second end of each branch is provided with second blocking means adapted to limit the propagation toward an adjacent branch of a discharge current induced by an electrical arc in a photoelectric cell of its own branch to a value less than or equal to a nominal current value for that branch.

21 Claims, 1 Drawing Sheet

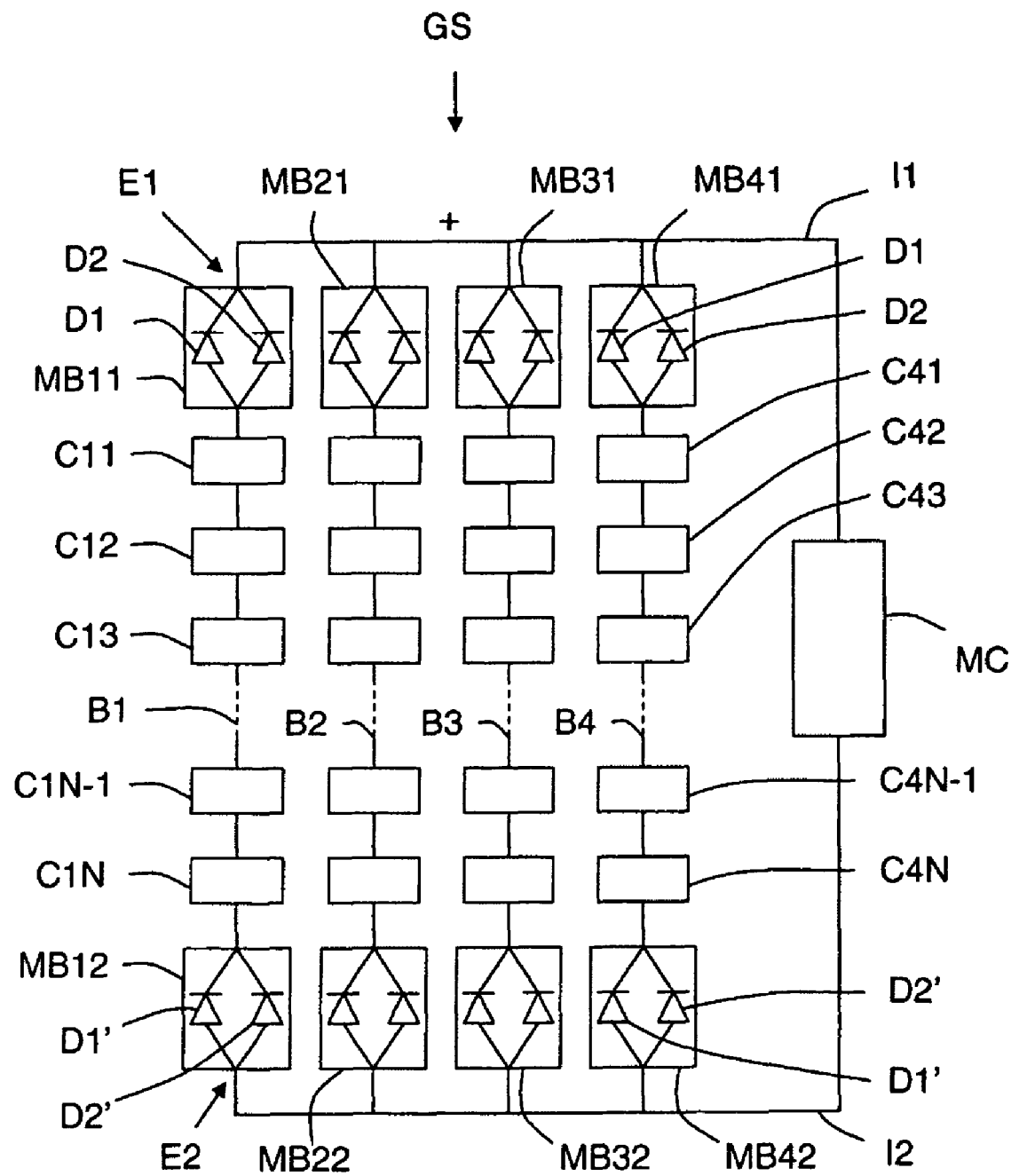
Single figure

LIMITED DISCHARGE CURRENT PROPAGATION SOLAR GENERATOR

CROSS-REFERENCE TO RELATED APPLICATIONS

This application is based on French Patent Application No. 0550768 filed Mar. 24, 2005, the disclosure of which is hereby incorporated by reference thereto in its entirety, and the priority of which is hereby claimed under 35 U.S.C. §119.

BACKGROUND OF THE INVENTION

1. Field of the Invention

The invention relates to the field of solar generators and in particular those embarked on spacecraft, such as satellites, for example.

2. Description of the Prior Art

Some solar generators have branches that are electrically connected in parallel at opposite first and second ends, respectively of positive and negative polarity, and each of which includes one or more photoelectric cells electrically connected in series and each covered on its front face with a protective window (or screen or filter).

The protective windows (or screens) are intended to protect the photoelectric cells from certain kinds of radiation, for example streams of protons and/or electrons, in order to guarantee a certain service life thereof. These protective windows (or screens) have to allow photons to pass through them, and are therefore generally made from a glass type material (for example a "coverglass" type material). As this material is not conductive, it tends to become charged, which sometimes causes localized electrical arcing known as a primary arc (or electrostatic discharge (ESD)) between a protective window and the photoelectric cell that it covers or an adjacent photoelectric cell.

This primary arc has been found to consist of two portions.

A first portion, known as the "blow-off" portion, takes the form of a current induced by the rapid discharging of the general capacitance of the system on which the solar generator is installed, for example a satellite.

A second portion, known as the "flash-over" portion, takes the form of a current induced by the slow discharging of the protective windows of at least some of the photoelectric cells, in accordance with a step by step propagation mechanism the propagation speed of which is of the order of $10^4$ m/s. This propagation mechanism occurs not only from the protective is subject to the primary arc by reason of the plasma that is created between the protective windows of the cells, but also from the protective windows of the cells of adjacent branches to the protective window of the cell subject to the primary arc by reason of said plasma and of the circulation of the slow discharge current from the branch subject to the arc to the adjacent branches, via their electrical connections. The slow discharge current generally circulates via the second ends of the branches, of negative polarity, as their first ends are generally provided with current blocking means such as diodes.

This flash-over (or slow discharge) can lead to certain photoelectric cells being degraded if its duration exceeds a threshold that depends on the material from which these photoelectric cells are made. This is the case in particular if the photoelectric cells are made from a semiconductor material such as gallium arsenide (GaAs) and the duration of the flash-over (or slow discharge) is greater than approximately 100 μs. This degradation leads to a reduction in the service life of the photoelectric cells (and therefore a reduction in their reliability), which is a particular problem if they cannot be replaced.

Thus one object of the invention is to overcome the problem cited above.

SUMMARY OF THE INVENTION

To this end the invention proposes a solar generator having at least two branches electrically connected in parallel at opposite first and second ends of positive and negative polarity, respectively, each branch comprising one or more photoelectric cells electrically connected in series and each covered by a protective window and having a first end provided with first blocking means adapted to block an electrical current coming from an adjacent branch.

This solar generator is characterized in that the second end of each branch is provided with second blocking means adapted to limit the propagation toward an adjacent branch of a discharge current induced by an electrical arc in a photoelectric cell of its own branch to a value less than or equal to a nominal current value for that branch.

The solar generator of the invention may have other features, and in particular, separately or in combination:

- the second blocking means of each branch may comprise at least one blocking diode; for example, the second blocking means of each branch comprise at least two blocking diodes electrically connected in parallel;
- the first blocking means of each branch may comprise at least one blocking diode; for example, the first blocking means of each branch comprise at least two blocking diodes electrically connected in parallel;
- its photoelectric cells may be made of semiconductor materials, for example gallium arsenide (GaAs);
- the photoelectric cells may have a size corresponding to a nominal branch current less than a nominal current threshold inducing arc extinction;
- its branches may be divided into at least two portions electrically connected and physically separated by one of the portions of an adjacent branch.

The invention is particularly well suited, although not exclusively so, to spacecraft and in particular to satellites.

BRIEF DESCRIPTION OF THE DRAWING

Other features and advantages of the invention will become apparent upon reading the following detailed description and examining the appended drawing, the single FIGURE of which is a very diagrammatic representation of one embodiment of a solar generator of the invention. The appended drawing completes the description of the invention as well as contributing to the definition of the invention, if necessary.

DETAILED DESCRIPTION OF THE PREFERRED EMBODIMENT

An object of the invention is to limit the propagation of slow discharge (or flash-over) currents in a solar generator.

It is considered hereinafter by way of nonlimiting example that the solar generator is intended to be installed on a spacecraft, for example a satellite. However, the invention is not limited to that application. It relates to any type of craft or system equipped with at least one solar generator liable to be the seat of electrical arcs.

As shown in the single FIGURE, the invention proposes a solar generator GS comprising at least two branches Bi electrically connected in parallel at opposite first and second ends E1, E2, the polarities of which are respectively positive (+) and negative (−), and each comprising one or more photoelectric cells Cij each having a front face covered by a protective window (or screen) electrically connected in series (for example of "coverglass" type).

In the example shown the solar generator GS comprises four branches B1 to B4 (i=1 to 4). However, a solar generator GS of the invention may have any number of branches greater than or equal to 2.

What is more, in the example shown, each branch Bi comprises N photoelectric cells Cij, where j=1 to N. N is equal to 16, for example. However, each branch Bi may include any number N of photoelectric cells Cij greater than or equal to 1.

The first and second ends E1, E2 of the branches Bi are connected to a power conditioning unit (PCU) MC via first and second cable connections 11 and 12, respectively.

Hereinafter the reference Cij denotes either a photoelectric cell or an assembly consisting of a photoelectric cell and a protective window.

Moreover, it is considered hereinafter that the photoelectric cells Cij are made from a semiconductor material, for example gallium arsenide (GaAs). However, the invention relates to any type of photoelectric cell that may be the seat of primary electrical arcs, conforming to the definition given in the introduction.

According to the invention, the first end E1 (of positive polarity) of each branch Bi comprises a first blocking module MBi1 for blocking an electrical current coming from an adjacent branch Bi' (i'≠i) and the second end E2 (of negative polarity) of each branch Bi comprises a second blocking module MBi2 for limiting the propagation to an adjacent branch Bi' (i'≠i) of a flash-over type discharge current induced by an electrical arc in a cell of the branch Bi to which it belongs, to a value less than or equal to the value of the nominal current of the branch Bi.

Accordingly, when a discharge current is induced by an electrical arc in a photoelectric cell Cij of a branch Bi, it flows in the direction of the second end E2 of that branch Bi and reaches its second blocking module MBi2. The latter module blocking said discharge current, the nominal current from the branch Bi is then compensated by the discharge current that passes through it. In other words, the discharge current that passes through the second blocking module MBi2 (blocking) is limited to the value of the nominal current of the branch Bi concerned.

In the case of a single photoelectric cell Cij made of gallium arsenide (GaAs), the nominal current of a branch Bi is from approximately zero to approximately 0.5 A according to the size of the photoelectric cell Cij.

Consequently, the discharge current that reaches a branch Bi' adjacent a branch Bi in which one of the photoelectric cells Cij is the subject of an electrical arc is reduced. This reduction is intended to enable extinction of the arc before the plasma propagates too far. The second blocking modules MBi2 therefore interfere with the mechanism of propagation of the discharges from the protective windows of the photoelectric cells Ci'j of the branches Bi' adjacent the branch Bi in which the arc occurs. This limits the propagation of the discharge to a small distance from the place at which the arc occurs, which amounts to saying that the time for which the arc is maintained falls below the threshold time beyond which a photoelectric cell may be damaged (equal to approximately 100 μs in the case of a gallium arsenide photoelectric cell). Because of this, there is no risk of the photoelectric cells being damaged by electrical arcs.

It is important to note that the contributions of the protective windows of the photoelectric cells Cij' of a branch Bi to maintaining an arc in another photoelectric cell Cij of the same branch Bi may be reduced by using a solar generator architecture of the type described in the patent documents EP 1373071 and US 2004/0112419. In that architecture, the branches are divided into at least two portions electrically connected and physically separated by one of the portions of an adjacent branch. The discharge propagation mechanism can then be restricted to a branch portion rather than to the whole of the branch.

The size of the photoelectric cells Cij setting the value of the nominal current of a branch Bi, it is therefore possible to choose the size of the photoelectric cells as a function of the threshold value of the nominal current enabling an arc to be extinguished. In other words, knowing the threshold value of the nominal current below which the arc of a branch Bi is extinguished (because it is no longer supported by the adjacent branches Bi'), a photoelectric cell size is chosen that fixes a nominal branch current lower than the threshold value.

For example, and as shown in the single FIGURE, each first blocking module MBi1 consists of two blocking diodes D1 and D2 connected in parallel. This is not obligatory, however. In fact, each first blocking module MBi1 may consist of a blocking diode or a plurality of blocking diodes connected in series and/or in parallel. Using at least two diodes D1 and D2 connected in parallel offers improved reliability. As a general rule, each first blocking module MBi1 may consist of any component or any set of components capable of blocking the photoelectric currents generated by the photoelectric cells Ci'j of the adjacent branches Bi' (i'≠i). Consequently, a first blocking module MBi1 can take the form of a combination of transistors, for example.

Moreover, and as shown in the single FIGURE, each second blocking module MBi2 may consist of two blocking diodes D1' and D2' connected in parallel, for example. This is not obligatory, however. In fact, each second blocking module MBi2 may consist of a blocking diode or a plurality of blocking diodes connected in series and/or in parallel. The use of at least two diodes D1' and D2' connected in parallel improves reliability. Generally speaking, each second blocking module MBi2 may consist of any component or set of components able at least partly to block (in the sense defined hereinabove) the discharge (flash-over) currents coming from one of the photoelectric cells Cij of its own branch Bi, so that only a current at most equal to the nominal current of its branch Bi can flow toward the adjacent branches Bi' (i'≠i) via their respective second ends E2 and the electrical connections between them. Consequently, a second blocking module MBi2 may take the form of a combination of transistors, for example.

The diodes D1' and D2' may be identical to or different from the diodes D1 and D2.

The reaction time of the blocking diodes (here D1' and D2') of a second blocking module MBi2 is of the order of 150 ns, which is sufficiently short to limit the propagation of the discharge (flash-over) current to around 2 mm between two photoelectric cells Cij and Cij' (j'≠j), if the propagation speed is of the order of $10^4$ m/s.

The invention is not limited to the solar generator embodiments GS described hereinabove by way of example, and encompasses all variants that the person skilled in the art might envisage that fall within the scope of the following claims.

There is claimed:

1. A solar generator having at least two branches electrically connected in parallel at opposite first and second ends of positive and negative polarity, respectively, each branch comprising one or more photoelectric cells electrically connected in series and each covered by a protective window and having a first end provided with first blocking means adapted to block an electrical current coming from an adjacent branch, wherein the second end of each branch is provided with second blocking means adapted to limit the propagation toward an adjacent branch of a discharge current induced by an electrical arc in a photoelectric cell of its own branch to a value less than or equal to a nominal current value for that branch, wherein said photoelectric cells have a size corresponding to a nominal branch current less than a nominal current threshold inducing arc extinction.

2. A solar generator according to claim 1 wherein said second blocking means of each branch comprise at least one blocking diode.

3. A solar generator according to claim 2 wherein said second blocking means of each branch comprise at least two blocking diodes electrically connected in parallel.

4. A solar generator according to claim 1 wherein said first blocking means of each branch comprise at least one blocking diode.

5. A solar generator according to claim 4 wherein that said first blocking means of each branch comprise at least two blocking diodes electrically connected in paralle.

6. A solar generator according to claim 2 wherein said photoelectric cells are made of semiconductor materials.

7. A solar generator according to claim 6 wherein said photoelectric cells are made of gallium arsenide (GaAs).

8. A solar generator according to claim 1 wherein said branches are divided into at least two portions electrically connected and physically separated by one of the portions of an adjacent branch.

9. A spacecraft including at least one solar generator according to claim 1.

10. A solar generator having at least two branches electrically connected in parallel at opposite first and second ends of positive and negative polarity, respectively, each branch comprising one or more photoelectric cells electrically connected in series and each covered by a protective window and having a first end provided with first blocking means adapted to block an electrical current coming from an adjacent branch, wherein the second end of each branch is provided with second blocking means adapted to allow propagation of current toward an adjacent branch but to limit that propagation to a value less than or equal to a nominal current value for the branch from which the current propagates.

11. A solar generator according to claim 10 wherein said second blocking means of each branch comprise at least one blocking diode.

12. A solar generator according to claim 11 wherein said second blocking means of each branch comprise at least two blocking diodes electrically connected in parallel.

13. A solar generator according to claim 10 wherein said first blocking means of each branch comprise at least one blocking diode.

14. A solar generator according to claim 13 wherein that said first blocking means of each branch comprise at least two blocking diodes electrically connected in parallel.

15. A solar generator according to claim 11 wherein said photoelectric cells are made of semiconductor materials.

16. A solar generator according to claim 15 wherein said photoelectric cells are made of gallium arsenide (GaAs).

17. A solar generator according to claim 10 wherein said photoelectric cells have a size corresponding to a nominal branch current less than a nominal current threshold inducing arc extinction.

18. A solar generator according to claim 10 wherein said branches are divided into at least two portions electrically connected and physically separated by one of the portions of an adjacent branch.

19. A spacecraft including at least one solar generator according to claim 10.

20. A solar generator according to claim 1 wherein the first and second blocking means for a given branch are each connected electrically in series with at least one photoelectric cell of said given branch.

21. A solar generator according to claim 10 wherein the first and second blocking means for a given branch are each connected electrically in series with at least one photoelectric cell of said given branch.

* * * * *